(12) United States Patent
Qin

(10) Patent No.: US 11,452,224 B2
(45) Date of Patent: Sep. 20, 2022

(54) BATTERY BOX LAMP WIRE INSTALLATION STRUCTURE

(71) Applicant: ACE SMART & TECH (NINGBO) CO., LTD., Ningbo (CN)

(72) Inventor: Yanbei Qin, Ningbo (CN)

(73) Assignee: ACE SMART & TECH (NINGBO) CO., LTD., Ningbo (CN)

( * ) Notice: Subject to any disclaimer, the term of this patent is extended or adjusted under 35 U.S.C. 154(b) by 74 days.

(21) Appl. No.: 16/800,297

(22) Filed: Feb. 25, 2020

(65) Prior Publication Data

US 2021/0068283 A1 Mar. 4, 2021

(30) Foreign Application Priority Data

Aug. 26, 2019 (CN) .......................... 201910792673.8

(51) Int. Cl.

| H05K 5/02 | (2006.01) |
|---|---|
| H01R 12/72 | (2011.01) |
| H01R 13/58 | (2006.01) |
| H05K 5/00 | (2006.01) |
| F21L 4/00 | (2006.01) |
| F21V 23/00 | (2015.01) |
| F21V 23/04 | (2006.01) |

(52) U.S. Cl.
CPC .............. *H05K 5/0247* (2013.01); *F21L 4/00* (2013.01); *F21L 4/005* (2013.01); *F21V 23/00* (2013.01); *F21V 23/0414* (2013.01); *H01R 12/72* (2013.01); *H01R 13/5833* (2013.01); *H05K 5/0069* (2013.01)

(58) Field of Classification Search
CPC ...... H05K 5/0247; H05K 5/0069; H05K 5/02; F21L 4/00; F21L 4/005; F21V 23/00; F21V 23/0414; H01R 12/72; H01R 13/5833
See application file for complete search history.

(56) References Cited

U.S. PATENT DOCUMENTS

| 10,135,044 B2 | 11/2018 | Qin | |
|---|---|---|---|
| 2002/0043959 A1* | 4/2002 | Tanaka | H01M 10/4257 320/116 |
| 2015/0295440 A1* | 10/2015 | Liao | H01M 50/213 320/103 |
| 2018/0062126 A1* | 3/2018 | Qin | H01M 50/271 |

* cited by examiner

*Primary Examiner* — Bao Q Truong
(74) *Attorney, Agent, or Firm* — W&K IP

(57) ABSTRACT

The present disclosure discloses a battery box lamp wire installation structure, which relates to the technical field of power supply devices and it comprises a case, provided with an accommodating cavity inside; a printed circuit board, horizontally located in the accommodating cavity and fixedly connected with the case; an end cap, movably mounted on one end of the case, and the end cap is provided with a wire hole A; a lamp wire, of which one end penetrating through the wire hole A and restrained within the end cap; a connector, detachably mounted at the inner side of the end cap and fixing the positive and negative ends of the lamp wire; the positive and negative ends of the lamp wire are in electrical connection with the printed circuit board respectively when the end cap is mounted onto the case.

2 Claims, 15 Drawing Sheets

BATTERY BOX LAMP WIRE INSTALLATION STRUCTURE

CROSS-REFERENCE TO RELATED APPLICATIONS

This application claims priority to Chinese Patent Application No. 201910792673.8 with a filing date of Aug. 26, 2019. The content of the aforementioned application, including any intervening amendments thereto, are incorporated herein by reference.

TECHNICAL FIELD

The present disclosure relates to the technical field of power supply devices, in particular to a battery box lamp wire installation structure.

BACKGROUND

A battery box is a common structure for supplying power. In the prior art, some have been used as a connecting latch to supply power for ornaments so as to achieve a luminous effect.

For instance, a patent with the authorized publication No. U.S. Ser. No. 10/135,044B2 discloses a multi-functional battery box, comprising: a case, having an accommodating cavity; a printed circuit board, located in the accommodating cavity and fixedly connected with the case; a power source, located in the accommodating cavity and in contact with the printed circuit board; an electro-acoustic transducer, fixedly arranged on the printed circuit board and electrically connected with the printed circuit board; an elastic piece, arranged on the case and in contact with the printed circuit board; a transfer switch, movably connected with the printed circuit board, and the transfer switch enables the electrical connection of the electro-acoustic transducer, the power supply and the printed circuit board or the electrical connection of the power source and the printed circuit board.

However, in the battery box with the above structure, as positive and negative ends of a lamp wire are often embedded into two holes of an insertion block and fixedly connected into the holes by welding, the connection strength is low. Therefore, the lamp wire is easily pulled down from the insertion block to cause failure of a switch box if a neglect occurred during the usage.

SUMMARY

One objective of the present disclosure is to overcome the shortcomings of the prior arts by providing a battery box lamp wire installation structure whereby a lamp wire is not easy to be pulled out and torn apart.

The technical solution of the present disclosure is as follows:

A battery box lamp wire installation structure, comprises a case, having an accommodating cavity; a printed circuit board, horizontally located in the accommodating cavity and fixedly connected with the case; an end cap, movably mounted on one end of the case, and the end cap is provided with a wire hole A; a lamp wire, of which one end penetrates through the wire hole A and is limited within the end cap; a connector, detachably mounted at the inner side of the end cap and fixing positive and negative ends of the lamp wire.

When the end cap is mounted on the case, the positive and negative ends of the lamp wire are in circuit connection with the printed circuit board respectively.

In one embodiment of the present disclosure, one end of the connector, the end of which close to the printed circuit board, is provided with two electric conductors which are fixedly connected with the positive and negative ends of the lamp wire and abut against the printed circuit board respectively so as to electrically connect the printed circuit board.

In a preferred embodiment of the present disclosure, one end of the lamp wire, the end of which penetrating through the wire hole A, is provided with a knot that is limited within the end cap.

In a further preferred embodiment of the present disclosure, the connector comprises a transverse plate arranged along the horizontal direction, and a vertical plate penetrating through the transverse plate and arranged along the vertical direction; the two electric conductors are mounted on the transverse plate and located at the two sides of the vertical plate; the inner side of the end cap protrudes outwards to form a positioning column and two vertical connecting columns; the knot is located between the two connecting columns; a positioning notch A is formed on each positioning column; the side edge of the transverse plate is embedded in the positioning notches A; and two screws penetrate through the upper and lower sides of the vertical plate respectively to be in screw connection with the two connecting columns.

In a further preferred embodiment of the present disclosure, the electric conductors cling to the bottom face of the transverse plate; one end, close to the printed circuit board, of each electric conductor obliquely extends in the direction far away from the printed circuit board to form a bending portion; and one end of the bending portion is transversely embedded in the transverse plate, while the other end thereof vertically abuts against the printed circuit board.

In a further preferred embodiment of the present disclosure, the other end, opposite to the bending portion, of each electric conductor vertically extends to form an insert portion that is inserted into the transverse plate to be fixed.

In a further preferred embodiment of the present disclosure, the connector comprises a convert column; one side, away from the end cap, of the convert column is recessed inward to form a groove for embedding the knot; the inner wall, close to the end cap, of the groove has a wire hole B for a lamp wire to penetrate through; the convert column extends toward the printed circuit board to form two wire clamping portions that are transversely arranged and located at the two sides of the convert column; the end cap extends inward along the wire hole A to form a positioning ring for embedding of the convert column; one side, away from the end cap, of the positioning ring is recessed inward to form a positioning notch B for embedding the wire clamping portions; one side, close to the printed circuit board, of each wire clamping portion is recessed inward to form a wire clamping groove; the positive and negative ends of the lamp wire are embedded in the two wire clamping grooves respectively and sandwiched between the printed circuit board and the wire clamping portion to electrically connect the printed circuit board.

In a further preferred embodiment of the present disclosure, a strip-shaped slot is formed along the outer wall of the convert column and penetrates through the groove and the wire hole B; a raised strip corresponding to the strip-shaped slot is formed by radially protruding inward along the inner wall of the wire hole A; and the raised strip is inserted into the strip-shaped slot transversely.

In a further preferred embodiment of the present disclosure, the outer fringe of one end, close to the end cap, of the convert column is tapered and is in tapered fit with the wire hole A.

The present disclosure also provides a battery box lamp wire installation structure, comprising: a case, having an accommodating cavity; a printed circuit board, located in the accommodating cavity and fixedly connected with the case; an end cap, movably mounted on one end of the case; a connector, detachably mounted at the outer side of the end cap and provided with a wire hole C; a lamp wire of which one end penetrates through the wire hole C and is limited within the connector; and two electric conductors, arranged at the inner side of the end cap and fixedly connected with the positive and negative ends of the lamp wire respectively.

When the end cap is mounted on the case, the two electric conductors abut against the printed circuit board respectively to be in circuit connection with the printed circuit board.

As a further improvement of the present disclosure, the upper and lower edges of the connector extend inward to form a buckle bulge respectively; the knot is located between the two buckle bulges; buckling grooves corresponding to the buckle bulge are formed at the outer side of the end cap; the connector is embedded in the end cap and is in snap joint with the end cap; the location, corresponding to the knot, on the end cap is vertically provided with a support wall; the two electric conductors are transversely embedded on the support wall respectively; one ends of the two electric conductors are fixedly connected with the positive and negative ends of the lamp wire by welding respectively, while the other ends thereof respectively abut against the printed circuit board to electrically connect the printed circuit board.

As a further improvement of the present disclosure, the connector is detachably mounted on the outer side of the end cap; one end, penetrating through the wire hole C, of the lamp wire is provided with a knot that is limited within the connector.

As a further improvement of the present disclosure, each electric conductor has a C-shaped section, the side walls of the C-shaped section abut against the printed circuit board, ribs are formed by outward extending from the opening ends of the C-shaped section along the vertical direction; the support wall has mounting notches corresponding to the electric conductors; and the two ribs penetrate through the mounting notches and cling to the support wall.

As a further improvement of the present disclosure, the inner side of the connector protrudes outward to form two pressing blocks, respectively correspond to the electric conductors, and press against two ribs of each electric conductor.

As a further improvement of the present disclosure, a connecting portion is formed by inward extending of the connector and penetrates through the end cap; one side, close to the wire hole C, of the connecting portion is vertically provided with a rope slot in a penetrated manner; the knot is located within the rope slot; the side wall, close to the printed circuit board, of the rope slot is transversely provided with two rope holes in a penetrated manner; the positive and negative ends of the lamp wire respectively penetrate through the rope holes; the connecting portion is vertically provided with two insertion holes in a penetrated manner; each insertion hole corresponds to one rope hole; each electric conductor is of a U-shaped structure and is embedded in one side, close to the printed circuit board, of the connecting portion; one end of the U-shaped structure is inserted into the insertion hole and penetrates the lamp wire; the other end of the U-shaped structure is located at the outer side of the connecting portion and vertically abuts against the printed circuit board to electrically connect the printed circuit board.

As a further improvement of the present disclosure, the connector transversely penetrates through the horizontal plane in which the center of the wire hole C is located along the two side walls of the rope slot to separate into detachable pressing blocks; and the inner side of the pressing block vertically extends to form a limiting portion that is embedded in the rope slot.

As a further improvement of the present disclosure, the two rope holes and the wire hole C are at the same horizontal plane; the connector transversely penetrates through the horizontal plane in which the center of the wire hole C is located to be separated into an upper half and a lower half portion in the vertical direction; and the upper half portion and the lower half portion of the connector are mutually imbedded.

Based on the above technical scheme, the advantages and technical effects achieved by the battery box lamp wire installation structure provided in the present disclosure include: the portion of the lamp wire penetrating in the end cap or connector is limited, so that the lamp wire and a switch box are relatively fixed and the portion of the lamp wire inserted in the switch box is not likely to be pulled out or even torn apart; in compare with the existing lamp wire installation structure, the lamp wire is high in installation strength; and due to the arrangement of the connector, there is no need to directly weld the lamp wire on the printed circuit board in assembly, therefore, the connection stability of other components on the printed circuit board is ensured; it is free of detaching the lamp wire in disassembly, thus the maintenance becomes easier, the electrical connection reliable, the assembly and disassembly convenient.

Figure 1:
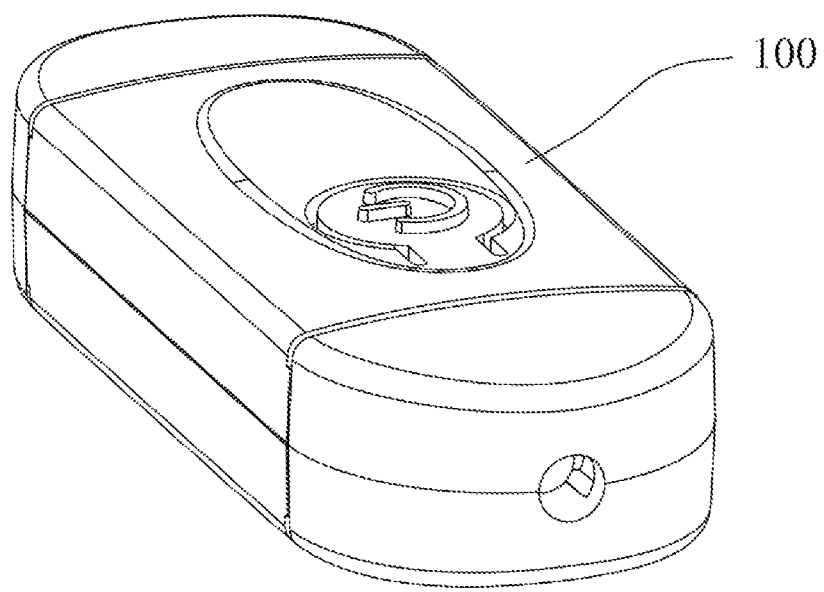
FIG. 1 is a perspective view of Embodiment One.
Figure 2:
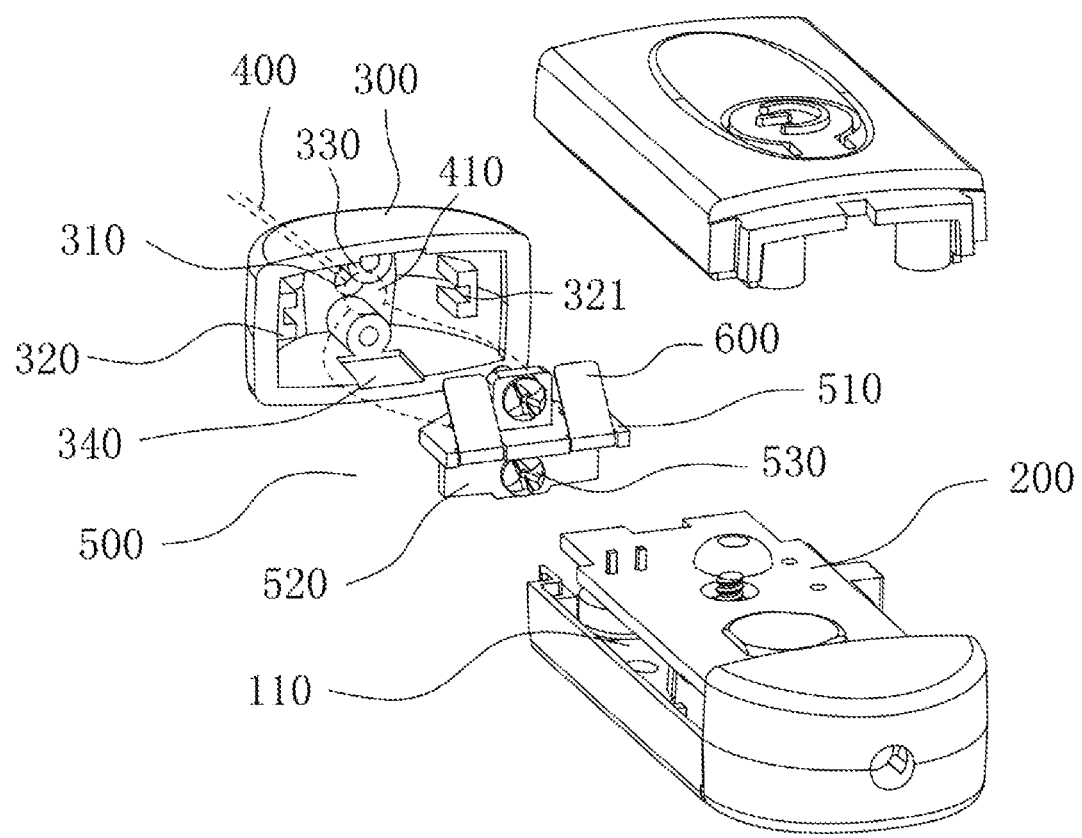
FIG. 2 is an exploded view of Embodiment One.
Figure 3:
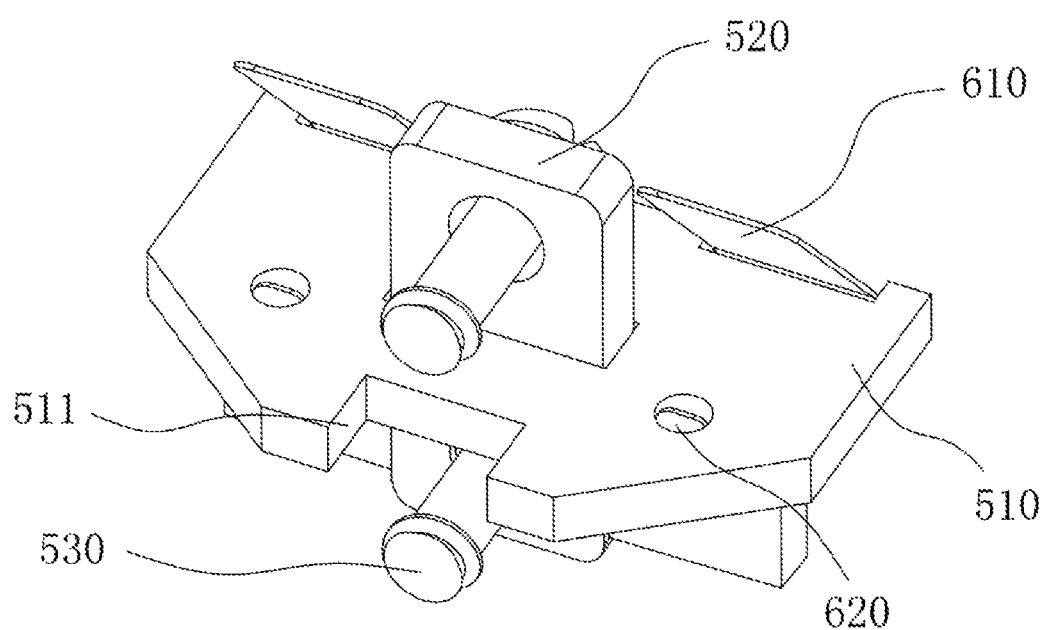
FIG. 3 is a perspective view of a connector in Embodiment One.
Figure 4:
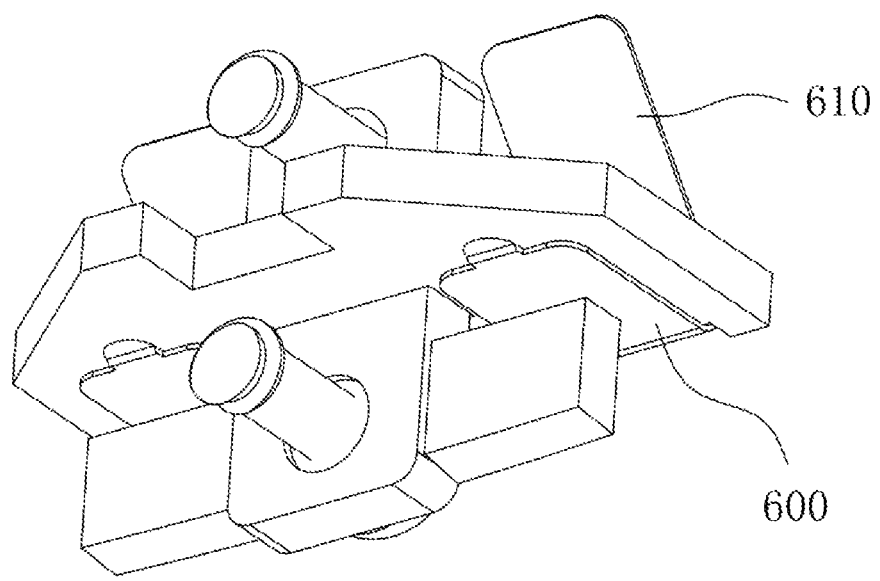
FIG. 4 is a perspective view of the connector in Embodiment One, viewed from another angle.

In the figures, 100 case; 110 accommodating cavity; 200 printed circuit board; 300 end cap; 310 wire hole A; 311 positioning ring; 311a positioning notch B; 312 raised strip;

320 positioning column; 321 positioning notch A; 330 connecting column; 340 positioning groove; 350 positioning notch C; 360 buckling groove; 370 support wall; 400 lamp wire; 410 knot; 500 connector; 510 transverse plate; 511 limiting groove; 520 vertical plate; 530 screw; 540 convert column; 541 groove; 542 wire hole B; 543 wire clamping portion; 543a wire clamping groove; 544 strip-shaped groove; 550 wire hole C; 560 positioning bulge; 570 buckling bulge; 580 clamping block; 590 connecting portion; 591 rope slot; 592 rope hole; 593 insertion hole; 594 limiting bulge; 5100 pressing block; 5101 limiting portion; 5110 mounting column; 5120 mounting hole; 600 electric conductor; 610 bending portion; 620 insert portion; 630 rib; 640 tip portion; 650 round hook portion.

EMBODIMENTS

The technical solution of the present disclosure will be further described hereinafter with the following embodiments and accompanying figures which the present disclosure is not limited to.

Embodiment One

As shown in FIGS. 1-4, a battery box lamp wire installation structure in this embodiment, comprises: the case 100, the printed circuit board 200, the end cap 300, the lamp wire 400, the connector 500 and two electric conductors 600, the lamp wire 400 is a double-stranded wire of which two strands are connected to the positive and negative poles of the printed circuit board 200 respectively; the electric conductors 600 can be made of copper.

The case 100 is internally provided with the accommodating cavity 110; the printed circuit board 200 is transversely located in the accommodating cavity 110 and fixedly connected with the case 100; the end cap 300 is buckled on one end of the case 100 and provided with the wire hole A 310; the lamp wire 400 penetrates through the wire hole A 310 and then knotted to form the knot 410; the knot 410 is larger than the wire hole A 310 so as to limit the knot 410 inside the end cap 300; the connector 500 can be detachably mounted at the inner side of the end cap 300; the two electric conductors 600 are arranged at one side of the connector 500, the side of which close to the printed circuit board 200; the two electric conductors 600 are fixedly connected with the positive and negative ends of the lamp wire 400 by welding respectively; when the end cap 300 is mounted on the case 100, the two electric conductors 600 are inserted below the printed circuit board 200 and abut against the printed circuit board 200 in the vertical direction, so that the positive and negative ends of the lamp wire 400 are connected with the positive and negative poles of the printed circuit board 200, thereby supplying power for ornaments.

In the present disclosure, the cooperate of the knot 410 and the end cap 300 makes the lamp wire 400 and the switch box relatively fixed; the portion of the lamp wire 400 extending into the switch box is not easy to be pulled out or even torn apart; in comparison with the existing lamp wire installation structure, the lamp wire 400 is high in installation strength, reliable in electrical connection and convenient in assembly and disassembly.

The connector 500 comprises the transverse plate 510 arranged along the horizontal direction and the vertical plate 520 arranged along the vertical direction penetrating through the transverse plate 510; the two electric conductors 600 are mounted on the transverse plate 510 and locate at the two sides of the vertical plate 520; the inner side of the end cap 300 protrudes outward to form two transverse positioning columns 320 and two vertical connecting columns 330; the knot 410 is located between the two connecting columns 330; the positioning notch A 321 is formed on the positioning column 320; two side edges of the transverse plate 510 are embedded in the two positioning notches A 321; and two screws 530 penetrate through the upper and lower sides of the vertical plate 520 respectively and are in screw joint with the two connecting columns 330.

During assembly, the portion of the lamp wire 400 penetrating through the end cap 300 is fixed with the two electric conductors 600 by welding; the opposite locations of the connector 500 and the end cap 300 are positioned by virtue of match of the transverse plate 510 and the positioning notches A 321; after the connector 500 is inserted into the end cap 300 along the positioning notches A 321 until the vertical plate 520 abuts against the connecting columns 300, the vertical plate 520 and the connecting columns 330 are screwed via two screws 530 so as to fix the connector 500 and the end cap 300.

Preferably, the end cap 300 is provided with two positioning grooves 340 for embedding of the vertical plate 520 along the insertion direction of the vertical plate 520 so as to bring convenience for further installation and positioning of the connector 500 and the end cap 300; one side, close to the end cap 300, of the transverse plate 510 is provided with the limiting groove 511 in which the knot 410 is located; the limiting groove 511 is used for limiting transverse movement of the knot 410; and the two connecting columns 330 are used for limiting the vertical movement of the knot 410; therefore, by virtue of match of the limiting groove 511 and the two connecting columns 330, the effect of fixing the knot 410 is good and the knot 410 has low possibility of displacement in the switch box to generate noise.

In this embodiment, the platy electric conductors 600 cling to the bottom face of the transverse plate 510; one ends, close to the printed circuit board 200, of the electric conductors 600 obliquely extend in the direction away from the printed circuit board 200 to form bending portions 610; one ends of the bending portions 610 are transversely embedded into the transverse plate 510; when the end cap 300 is mounted on the case 100, the printed circuit board 200 transversely abuts against the bending portions 610 and gradually compresses the bending portions 610 in the vertical direction until the bending portions 610 vertically abut against the printed circuit board 200; owing to own elasticity, the bending portions 610 are capable of effectively abutting against the printed circuit board 200, therefore, electric connection is reliable; in addition, by transversely embedding one ends of the bending portions 610 into the transverse plate 510, the electric conductors 600 are effectively prevented from displacement as a result of uneven force applied by the printed circuit board 200.

Preferably, the other end which opposite to the bending portion 610, of the electric conductors 600 vertically extends to form the insert portions 620 that are inserted into the transverse plate 510 for fixation so as to further limit the installation positions of the electrical conductors 600 and facilitate positioning and installation of the electric conductors 600; the insert portions 620 can be in interference fit with the transverse plate 510 to fix the electric conductors 600 or fix the electric conductors 600 by welding.

Embodiment Two

Figure 5:
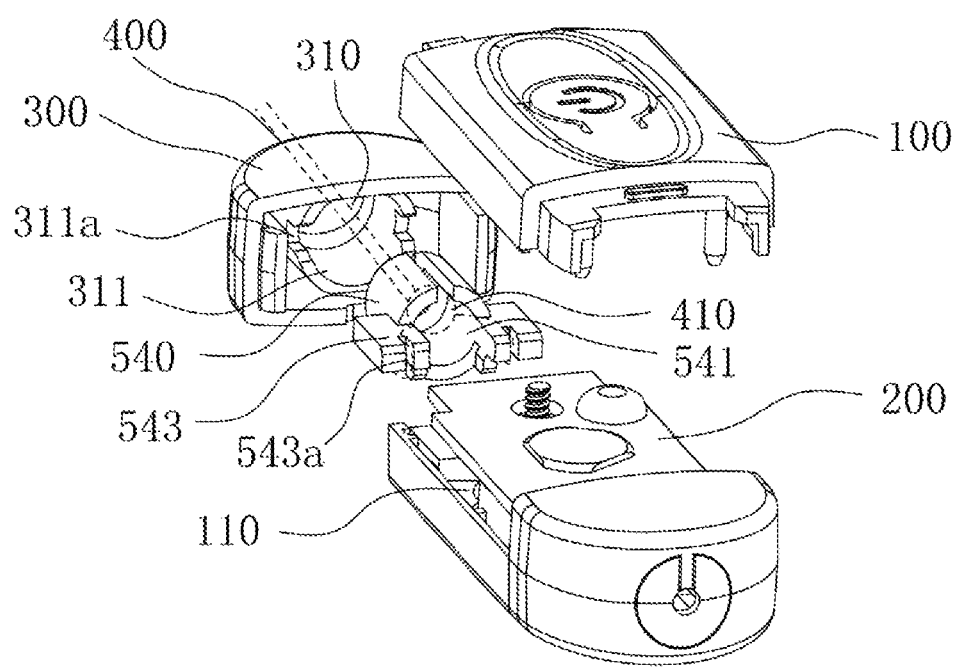
FIG. 5 is an exploded view of Embodiment Two.
Figure 6:
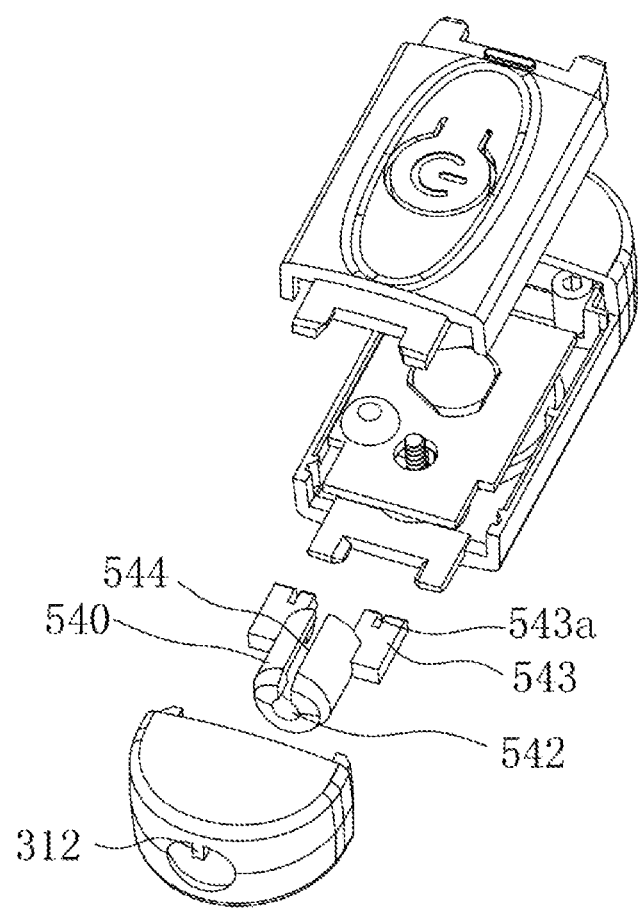
FIG. 6 is an exploded view of Embodiment Two, viewed from another angle.

As shown in FIGS. 5-6, Embodiment Two has the substantially similar structure to that of Embodiment One, mainly differing in the specific structure of the connector 500, the matched installation structure of the end cap 300 and the connector 500, and absence of electric conductors 600.

To be specific, the connector 500 comprises a convert column 540; one side, away from the end cap 300, of the convert column 540 inward inks to form a groove 541 for embedding of the knot 410; the inner wall, close to the end cap 300, of the groove 541 has a wire hole B 542 for a lamp wire 400 to penetrate through; the convert column 540 extends toward the printed circuit board 200 to form two wire clamping portions 543 that are transversely arranged and at two sides of the convert column 540; the end cap 300 extends inward along the wire hole A 310 to form a positioning ring 311 for embedding of the convert column 540; one side, away from the end cap 300, of the positioning ring 311 inward sinks to form a positioning notch B 311*a* for embedding of each wire clamping portion 543; one side, close to the printed circuit board 200 of each wire clamping portion 543 inward sinks to form a wire clamping groove 543*a*; the positive and negative ends of the lamp wire 400 are embedded in the two wire clamping grooves 543*a* respectively and sandwiched between the printed circuit board 200 and the wire clamping portions 543 to electrically connect the printed circuit board 200.

During assembly, the lamp wire 400 penetrates through the wire hole A 310 and the wire hole B 542 and then knotted to form a knot 410 that is larger than the wire hole B 542 so as to limit the knot 410 into the groove 541, next, the convert column 540 is embedded in the positioning ring 311 and positioned and installed on the end cap 300 by virtue of match of the wire clamping portions 543 and the positioning notches B 311*a*; conductive cores are exposed after outer insulted layers of the positive and negative ends of the lamp wire 400 are peeled off and then embedded in the wire clamping grooves 543*a*, so when the end cap 300 is mounted on the case 100, the conductive cores of the lamp wire 400 are sandwiched between the printed circuit board 200 and the wire clamping portions 543 to electrically connect the printed circuit board 200.

In this embodiment, the technical effect of improving the installation strength of the lamp wire 400 can be also realized, and the lamp wire 400 is fixed without welding, therefore, installation is simple and convenient.

Preferably, a strip-shaped slot 544 is formed along the outer wall of the convert column 540 and runs through the groove 541 and the wire hole B 542; a raised strip 312 corresponding to the strip-shaped slot 544 is formed by radially protruding inward along the inner wall of the wire hole A 310; and the raised strip 312 is inserted into the strip-shaped slot 544 transversely.

By means of the strip-shaped slot 544, the lamp wire 400 can penetrate through the wire hole B 542 conveniently. The raised strip 312 is arranged correspondingly on the end cap 300 to enhance the closed effect of the switch box, and rain and impurities are prevented from entering the switch box, therefore, better reliability.

Furthermore, the outer fringe of one end, close to the end cap 300, of the convert column 540 is tapered and is in tapered fit with the wire hole A 310 so that the convert column 540 and the end cap 300 cling to each other more closely, the convert column 540 is prevented from extending out of the wire hole, and the switch box has a beautiful and neat appearance.

Embodiment Three

Figure 7:
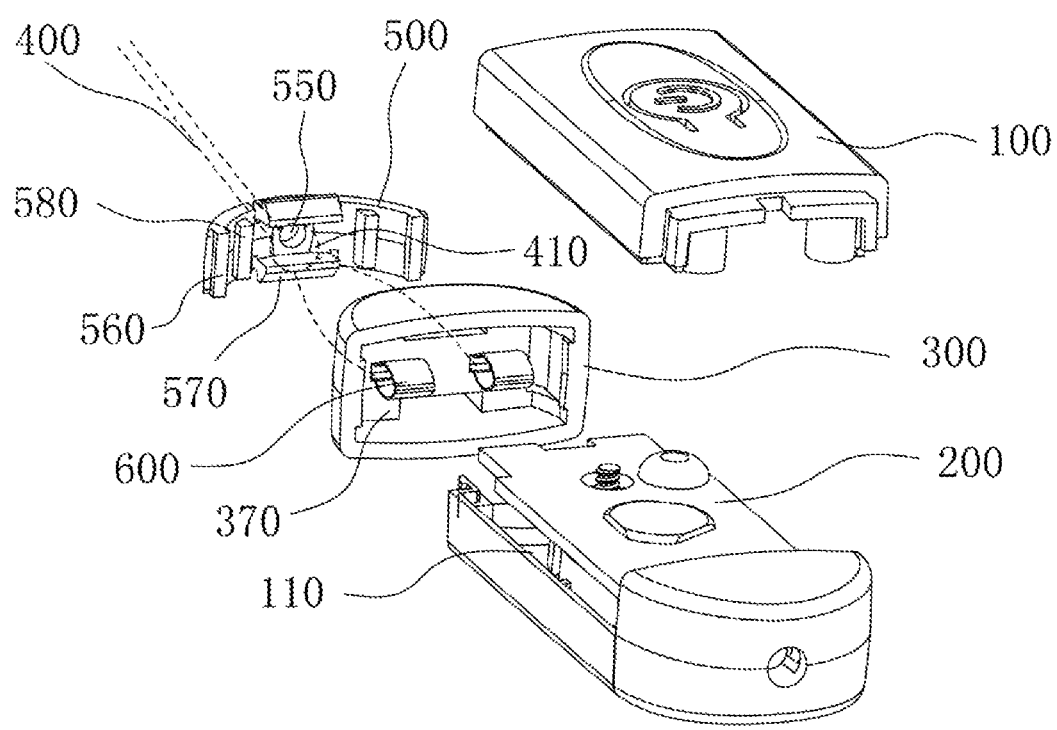
FIG. 7 is an exploded view of Embodiment Three.
Figure 8:
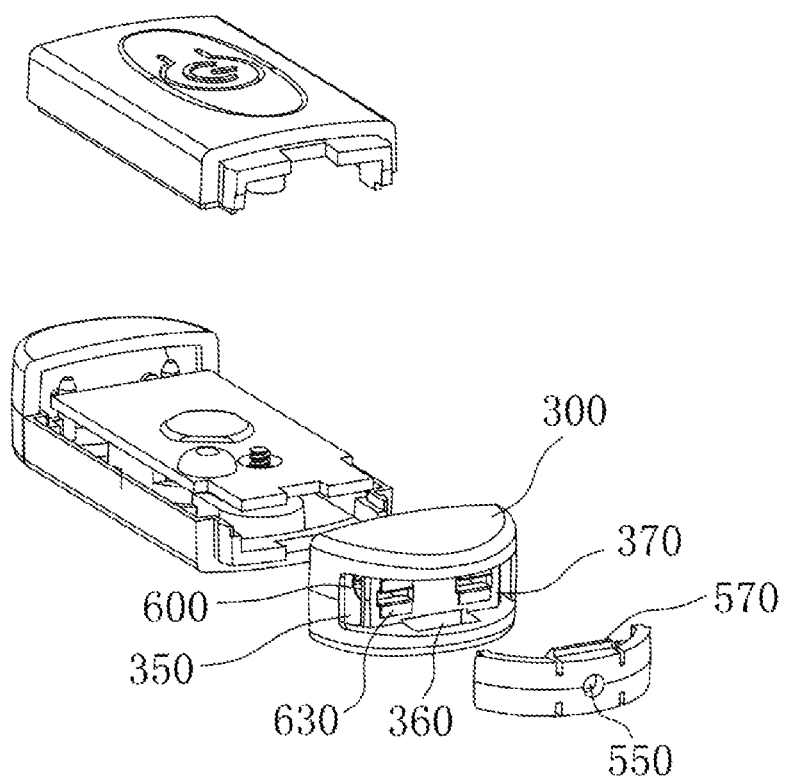
FIG. 8 is an exploded view of Embodiment Three, viewed from another angle.
Figure 9:
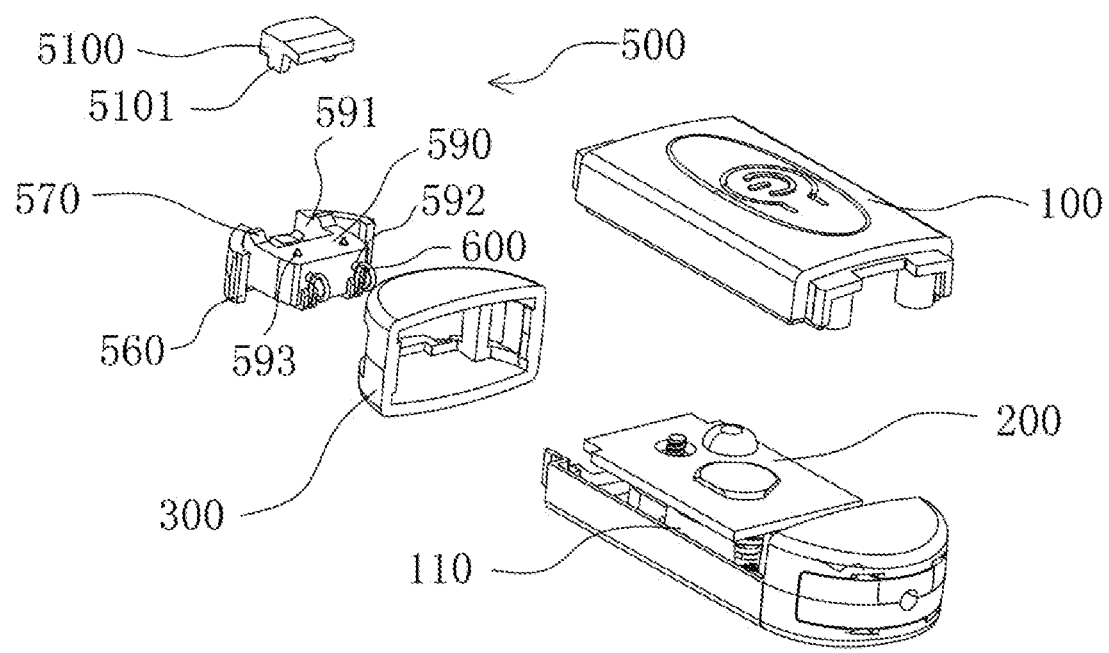
FIG. 9 is an exploded view of Embodiment Four.
Figure 10:
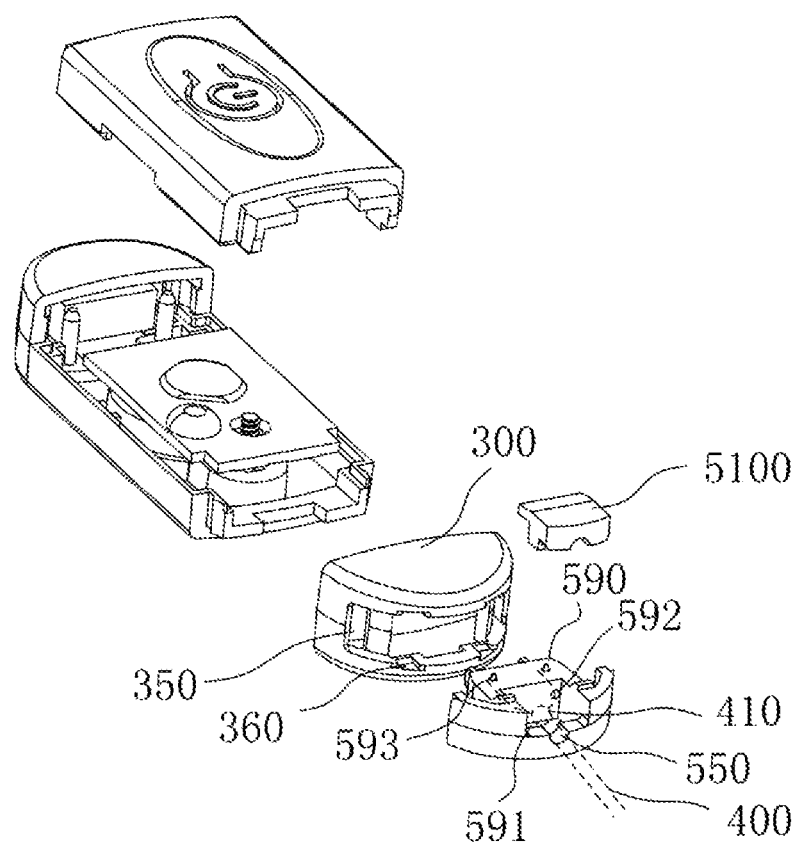
FIG. 10 is an exploded view of Embodiment Four, viewed from another angle.
Figure 11:
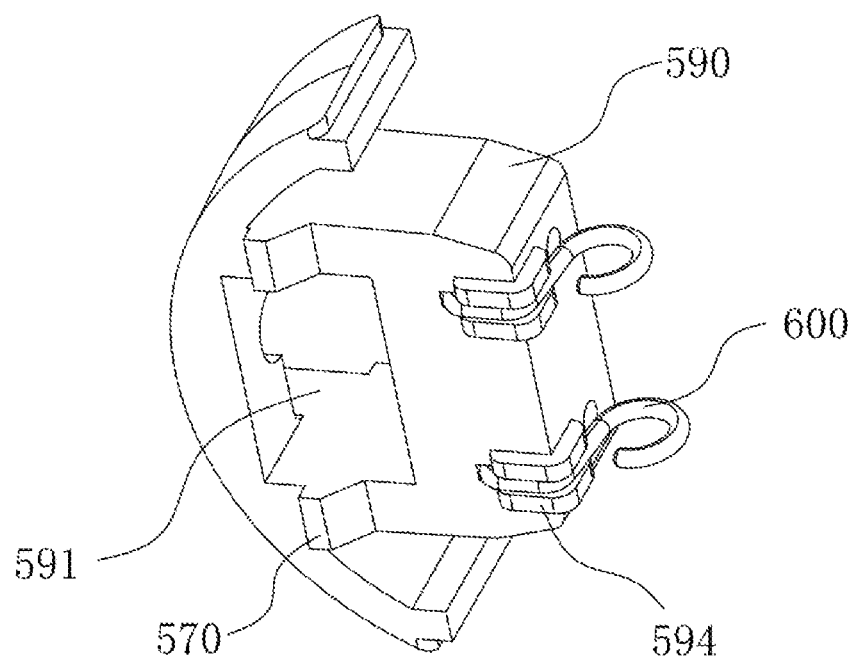
FIG. 11 is a diagram showing an installation structure of the connector and electric conductors in Embodiment Four.
Figure 12:
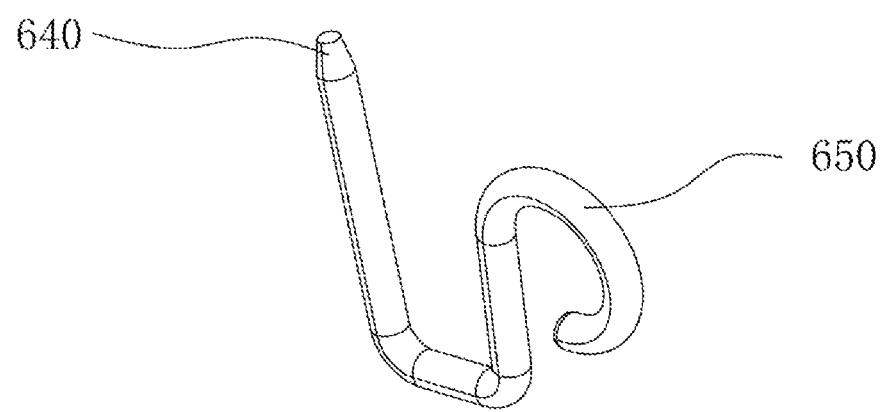
FIG. 12 is a schematic structural diagram of the electric conductors in Embodiment Four.

As shown in FIGS. 7-8, the battery box lamp wire installation structure in this embodiment also comprises a case 100, a printed circuit board 200, an end cap 300, a lamp wire 400, a connector 500 and two electric conductors 600, the case 100, the printed circuit board 200 and the lamp wire 400 have the same structure to that in Embodiment one, differing in that: the connector 500 is buckled on the outer side of the end cap 300 and is provided with a wire hole C 550 thereon; the lamp wire 400 penetrates through the wire hole C 550 and is knotted to form a knot 410 that is limited within the connector 500; the two electric conductors 600 are arranged on the inner side of the end cap 300 and fixedly connected with the positive and negative ends of the lamp wire 400 respectively; when the end cap 300 is mounted on the case 100, the two electric conductors 600 respectively abut against the printed circuit board 200 and electrically connect the printed circuit board, two sides of the end cap 300 are respectively provided with a positioning notch C 350, and two sides of the connector 500 are provided with positioning bulges 560 corresponding to the positioning notches C 350 to bring the convenience for positioning and installation of the connector 500 and the end cap 300.

Specifically, the upper and lower edges of the connector 500 respectively extend inward to form buckle bulge 570; the knot 410 is located between the two buckle bulges 570; buckling grooves 360 corresponding to the buckle bulge 570 are formed at the outer side of the end cap 300; the connector 500 is embedded in the end cap 300 and is in snap joint with the end cap 300; the location, corresponding to the knot 410, on the end cap 300 is vertically provided with a support wall 370; the two electric conductors 600 are transversely embedded on the support wall 370 respectively; one ends of the two electric conductors 600 are fixedly connected with the positive and negative ends of the lamp wire 400 by welding respectively, while the other ends respectively abut against the printed circuit board 200 to electrically connect the printed circuit board 200.

During assembly, the lamp wire 400 penetrates through the wire hole C 550 and then knotted to form a knot 410 that is larger than the wire hole C 550 so as to limit the knot 410 into the connector 500; next, the positive and negative ends of the lamp wire 400 are fixedly connected with the two electric conductors 600 preinstalled on the support wall 370 by welding respectively; then the connector 500 is clamped in the end cap 300 to fix the connector 500; in such a case, when the end cap 300 is mounted on the case 100, the two electric conductors 600 respectively abut against the printed circuit board 200, therefore, the effect of improving the installation strength of the lamp wire 400 is achieved, and installation is convenient.

The electric conductor 600 has a C-shaped section; two side walls of the C-shaped section take on an outward-protruding arc shape, one side wall props against the printed circuit board 200 in the vertical direction; ribs 630 are formed by outward extending from the opening ends of the C-shaped section along the vertical direction; the support wall 370 has mounting notches corresponding to the electric conductors 600; and the two ribs 630 penetrate through the mounting notches and cling to the support wall 370.

In case of installing the electric conductors 600, the two ribs 630 are oppositely pressed to pass through the mounting notches, and then distract and abut against the mounting notches under the effect of own elasticity so as to fix the electric conductors 600 on the end cap 300.

Further, two pressing blocks 580 are formed by protruding outward from the inside of the connector 500, respectively correspond to the electric conductors 600, and press against the two ribs 630 of each electric conductor 600 so as to avoid poor contact between the electric conductors 600 and the printed circuit board 200 due to retraction of the electric conductors 600 under the effect of the printed circuit board 200.

Embodiment Four

As shown in FIGS. 9-12, this embodiment has the substantially same principle to that in Embodiment Three, mainly differing in the specific structure of the connector 500 as well as the specific structure and installation mode of the electric conductors 600.

Specifically, a connecting portion 590 is formed by inward extending of the connector 500 and penetrates through the end cap 300; one side, close to the wire hole C 550, of the connecting portion 590 is vertically provided with a rope slot 591 in a penetrated manner; the knot 410 is located within the rope slot 591; the side wall, close to the printed circuit board 200, of the rope slot 591 is transversely provided with two rope holes 592 in a penetrated manner; the positive and negative ends of the lamp wire 400 respectively penetrate through the rope holes 592; the connecting portion 590 is vertically provided with two insertion holes 593 in a penetrated manner; each insertion hole 593 corresponds to one rope hole 592; the electric conductors 600 are of a U-shaped structure and are embedded in one side, close to the printed circuit board 200, of the connecting portion 590; one end of the U-shaped structure is provided with a tip portion 640 penetrating through the insertion holes 593, while the other end of the U-shaped structure is provided with a round hook portion 650 by extending toward the printed circuit board 200; and the round hook portion 650 vertically abuts against the printed circuit board 200.

During assembly, the lamp wire 400 penetrates through the wire hole C 550 and then knotted to form a knot 410 that is larger than the wire hole C 550 so as to limit the knot 410 into the rope slot 591; next, the positive and negative ends of the lamp wire 400 respectively penetrate through the two rope slots 591; the tip portions 640 of the electric conductors 600 penetrate through the insertion holes 593 and pierce through the insulated skin of the lamp wire 400 to make the electric conductors 600 contact with the conductive cores of the lamp wire 400; and then the connector 500 is clamped in the end cap 300 to fix the connector 500, so when the end cap 300 is mounted on the case 100, the two electric conductors 600 respectively abut against the printed circuit board 200.

In this embodiment, the technical effect of improving the installation strength of the lamp wire 400 can also be realized, and the lamp wire 400 is fixed without welding, therefore, installation is simple and convenient.

Further, two limiting bulges 594 are arranged at the location, corresponding to each electric conductor 600, on the connecting portion 590; each electric conductor 600 is embedded between the two limiting bulges 594 to prevent this electric conductor 600 from displacement under the effect of the printed circuit board 200.

To reduce the difficulty in penetrating the lamp wire 400 through the rope hole 592, the connector 500 transversely penetrates through the horizontal plane in which the center of the wire hole C 550 is located along the two side walls of the rope slot 591 to separate into a detachable pressing block 5100. Therefore, in case of installing the lamp wire 400, the pressing block 5100 is detached to bring convenience for artificial operation, and then installed on the connector 500 after installation of the lamp wire 400, and when the connector 500 is embedded in the end cap 300, the pressing block 5100 is pressed by the end cap 300 and the connector 500, and prevented from transversely disengaging from the connector 500 by virtue of a limiting portion 5101.

Embodiment Five

Figure 13:
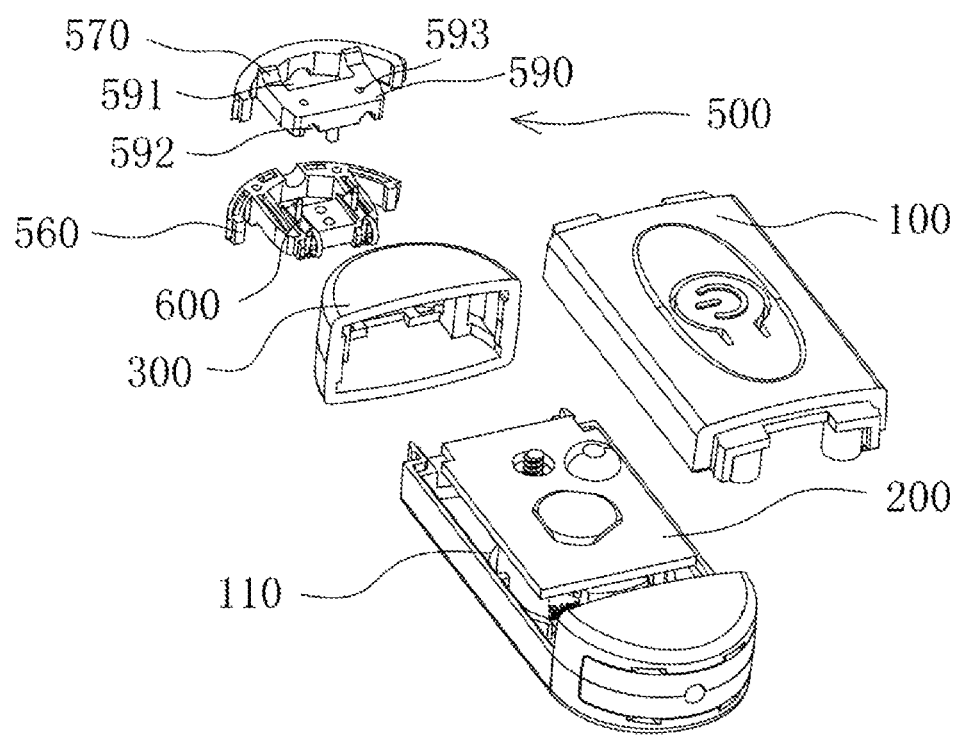
FIG. 13 is an exploded view of Embodiment Five.
Figure 14:
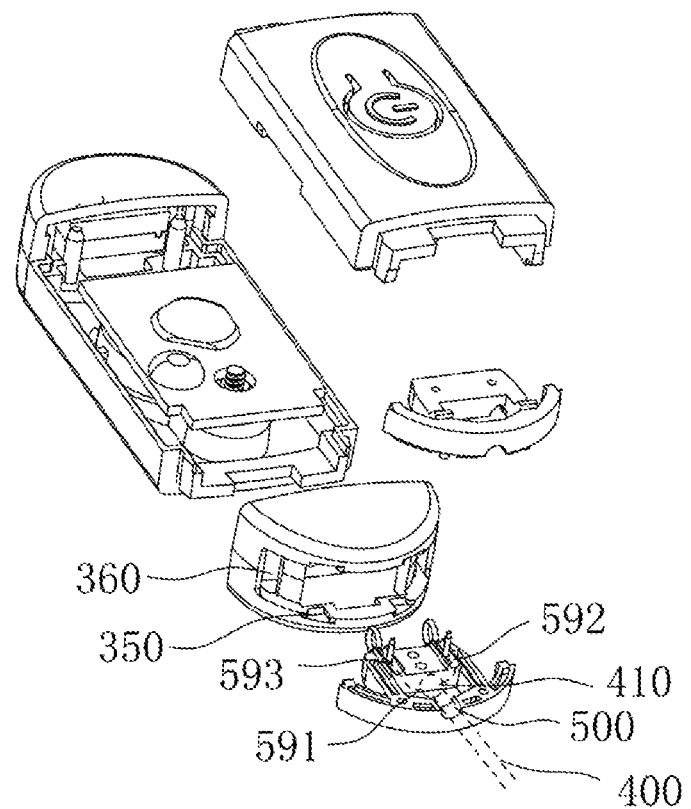
FIG. 14 is an exploded view of Embodiment Five, viewed from another angle.
Figure 15:
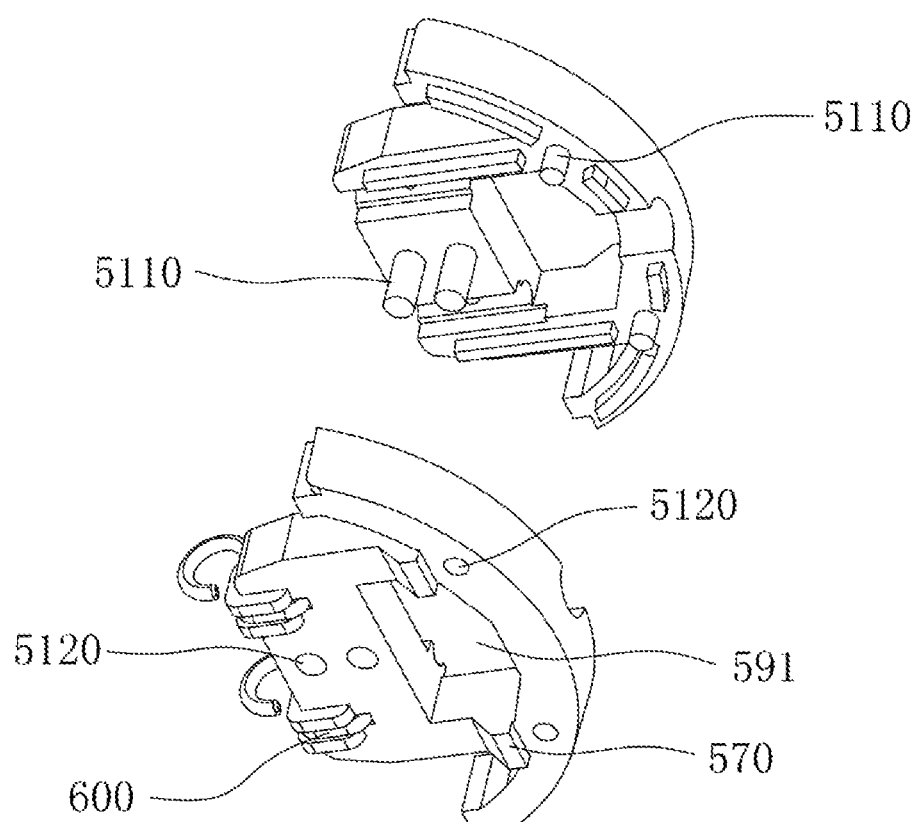
FIG. 15 is a diagram showing an installation structure of the connector and the electric conductors in Embodiment Five.

As shown in FIGS. 13-15, this embodiment has the substantially same structure and work principle to those in Embodiment Four, mainly differing in separation of the connector 500.

To be specific, the two rope holes 592 and the wire hole C 550 are at the same horizontal plane; the connector 500 transversely penetrates through the horizontal plane in which the center of the wire hole C 550 is located to be separated into upper half and lower half portions in the vertical direction; and the upper half portion and the lower half portion of the connector 500 are mutually imbedded so as to reduce installation difficulty of the lamp wire 400 and have high production efficiency.

During assembly, after the lamp wire 400 penetrates through the rope hole 592 on the upper half portion or lower half portion of the connector 500, the upper half portion and the lower half portion of the connector 500 are mutually imbedded; and the tip portions 640 of the electric conductors 600 penetrate through the insertion holes 593 to contact the conductive cores of the lamp wire 400, with other assembly steps referred to in Embodiment Three.

The upper half portion of the connector 500 bulges downward to form a plurality of mounting columns 5110; the lower half portion of the connector 500 is provided with a plurality of mounting holes 5120 corresponding to the plurality of mounting columns 5110; the mounting columns 5110 are inserted into the mounting holes 5120 to make the upper half portion and the lower half portion of the connector 500 imbedded to each other so as to facilitate assembly and fixation of the connector 500. Furthermore, it is permissible that the mounting columns 5110 and the mounting holes 5120 are mounted on either the upper half portion or the lower half portion of the connector 500.

The embodiments described herein are intended for illustrating the spirit of the present disclosure only. Those skilled in the technical field of the present disclosure can make various modifications or additions or adopt similar alternatives to the embodiments described herein without departure from the spirt of the present disclosure or going beyond the definitions of the claims attached (e.g., knot limitation may be substituted by pressing the lamp wire with a pressing plate).

I claim:

1. A battery box lamp wire installation structure, wherein it comprises:
   a case, provided with an accommodating cavity inside;
   a printed circuit board, horizontally located in the accommodating cavity and fixedly connected with the case;
   an end cap, movably mounted on one end of the case, and the end cap is provided with a wire hole A;
   a lamp wire, of which one end penetrating through the wire hole A and restrained within the end cap;
   a connector, detachably mounted at the inner side of the end cap and fixing the positive and negative ends of the lamp wire; the positive and negative ends of the lamp wire are in electrical connection with the printed circuit board respectively when the end cap is mounted onto the case;
   wherein one end of the connector, the end of which close to the printed circuit board, is provided with two electric conductors which are fixedly connected with the positive and negative ends of the lamp wire and abut against the printed circuit board respectively so as to electrically connect the printed circuit board;

wherein the connector comprises a transverse plate arranged along the horizontal direction, and a vertical plate penetrating through the transverse plate and arranged along the vertical direction; the two electric conductors are mounted on the transverse plate and located at the two sides of the vertical plate; the inner side of the end cap protrudes outwards to form a positioning column and two vertical connecting columns; the knot is located between the two connecting columns; a positioning notch A is formed on each positioning column; the side edge of the transverse plate is embedded in the positioning notches A; and two screws penetrate through the upper and lower sides of the vertical plate respectively to be in screw connection with the two connecting columns.

2. The battery box lamp wire installation structure of claim 1, wherein one end of the lamp wire, the end of which penetrating through the wire hole A, is provided with a knot that is limited within the end cap.

\* \* \* \* \*